United States Patent [19]
Igel

[11] Patent Number: 5,814,874
[45] Date of Patent: Sep. 29, 1998

[54] SEMICONDUCTOR DEVICE HAVING A SHORTER SWITCHING TIME WITH LOW FORWARD VOLTAGE

[75] Inventor: Guenter Igel, Emmendingen, Germany

[73] Assignee: General Semiconductor Ireland, Macroon, Ireland

[21] Appl. No.: 680,669

[22] Filed: Jul. 16, 1996

[30] Foreign Application Priority Data

Jul. 21, 1995 [DE] Germany .................. 195 26 739.7

[51] Int. Cl.$^6$ .................. H01L 27/075; H01L 29/47; H01L 29/812; H01L 31/07
[52] U.S. Cl. .................. 257/475; 257/485
[58] Field of Search .................. 257/471, 475, 257/476, 480, 481, 482, 485, 486

[56] References Cited

U.S. PATENT DOCUMENTS

| | | |
|---|---|---|
| 3,560,809 | 2/1971 | Terakado . |
| 3,579,278 | 5/1971 | Heer . |
| 3,657,615 | 4/1972 | Driver . |
| 3,739,243 | 6/1973 | Semichon et al. . |
| 3,762,945 | 10/1973 | DiLorenzo . |
| 3,891,479 | 6/1975 | Zwernemann . |
| 3,904,449 | 9/1975 | DiLorenzo et al. . |
| 3,921,192 | 11/1975 | Goronkin et al. . |
| 4,060,820 | 11/1977 | Pucel et al. . |
| 4,310,362 | 1/1982 | Roche et el. . |
| 4,454,523 | 6/1984 | Hill . |
| 5,614,755 | 3/1997 | Hutter et al. .................. 257/471 |

OTHER PUBLICATIONS

Gearhart, et al., "A Monolithic 250 Ghz Schottky–Diode Receiver," IEEE, Transactions on Microwave Theory and Techniques, vol. 42, No. 12, Dec. 1994, pp. 2504 to 2511.

Strohm, K. M., Luy, J.F., Buchler, J., Schaffler, F. and Schaub, A, "Planar 100 Ghz Silicon Detector Circuits," Mondetime Engineering 15 (1991) pp. 285–288.

Strohm, K. M., Buechler, J. and Luy, J.F., "A Monolithic Millimeter Wave Integrated Silicon Slot Line Detector," APMC '93, vol. 1, pp. 7–34 to 7–37.

Moroshima Heiji, et al., Patent Abstracts of Japan, vol. 006, No. 107 (E–1113), 17. Jun. 1982 & JP–A–57 037886 2 Mar. 1982.

Gearhart, et al., a Monolithic 250 Ghz Schottky–Diode Receiver, IEEE Transactions on Microwave Theory and Techniques, vol. 42, No. 12, Dec. 1994.

European Search Report, 12.11.96, EP 96 11 0021.

*Primary Examiner*—Ngân V. Ngô
*Attorney, Agent, or Firm*—Plevy & Associates

[57] ABSTRACT

A semiconductor device having a semiconductor substrate and an epitaxial layer deposited thereon which supports a patterned insulating layer on which a metal layer is provided. To achieve a lower capacitance of the semiconductor device with unchanged forward voltage, the epitaxial layer consists of first and second epitaxial layers, the first epitaxial layer which adjoins the semiconductor substrate having a higher dopant concentration than and being of the same conductivity type as the second epitaxial layer.

18 Claims, 1 Drawing Sheet

SEMICONDUCTOR DEVICE HAVING A SHORTER SWITCHING TIME WITH LOW FORWARD VOLTAGE

FIELD OF INVENTION

The present invention relates generally to semiconductor devices and more particularly, to a semiconductor device comprising a semiconductor substrate having epitaxial layers deposited thereon which is covered by a patterned insulating layer on which a metal layer is provided.

BACKGROUND OF THE INVENTION

Semiconductor devices comprised of a semiconductor substrate having an epitaxial layer covered by a patterned insulating layer on which a metal layer is provided, find particular application as Schottky diodes. Such diodes are appropriate, for high speed switching, for example. This property is essential in the development of power supplies, which should have high efficiency and high reliability and cause as little electromagnetic interference as possible. Schottky diodes are used for power supplies in the telecom field, for example. Increasingly stringent requirements are being placed on the properties of Schottky diodes, so that an improvement is needed.

It is desirable that the capacitance of a Schottky diode be as low as possible, because this reduces the switching time, which is proportional to the capacitance. Furthermore, as low a reverse current as possible is desirable, so that diode dissipation can be kept low. On the other hand, as low a forward voltage as possible is also desirable, so that the diode can be operated at low voltages. The forward voltage of Schottky diodes is lower than that of conventional pn diodes occupying the same area. But the forward voltage and the capacitance are dependent of the dopant concentration. The product of the capacitance and the forward voltage of a Schottky diode is independant of the dopant concentration if the area is not changed. A further result of the relating dopant concentration is, that a small capacitance and a high forward voltage are connected with a low reverse current and vice versa. Thus, it is difficult to meet these conflicting requirements placed on a Schottky diode, namely to achieve a low capacitance and a low forward voltage. The same difficulty is encountered in all semiconductor devices comprised of a semiconductor substrate having an epitaxial layers covered by a patterned insulating layer on which a metal layer is provided.

It is, therefore, an object of the present invention to provide a semiconductor device of the above kind, having a shorter switching time without the resultant increase in the forward voltage as is found in the prior art semiconductor devices.

SUMMARY OF THE INVENTION

A semiconductor device comprising a semiconductor substrate, a first epitaxial layer deposited on said semiconductor substrate, and a second epitaxial layer deposited on said first epitaxial layer. One of the first and second epitaxial layers of the semiconductor device has a higher dopant concentration than the other of the first and second epitaxial layers.

The semiconductor device also comprises a patterned insulating layer deposited on the second epitaxial layer. A metal layer is deposited on the patterned insulating layer. Additionally, the first and second epitaxial layers of the semiconductor device are of a same conductivity type.

BRIEF DESCRIPTION OF THE DRAWINGS

For a detailed understanding of the invention, reference should be made to the following detailed description taken in conjunction with the accompanying drawings wherein.

DETAILED DESCRIPTION OF THE INVENTION

The present invention attains the above stated object by providing a semiconductor device of the above kind wherein the epitaxial layer comprises a first and second epitaxial layers, the first epitaxial layer, which adjoins the semiconductor substrate, having a higher dopant concentration than and being of the same conductivity type as the second epitaxial layer.

In the semiconductor device according to the present invention, the capacitance is lower than in the semiconductor device having one uniformly doped epitaxial layer. This results in a reduction of the reverse current. In the semiconductor device according to the present invention, the current/voltage characteristic is not shifted in an unchanged form toward higher voltages, which would increase the forward voltage. The forward voltage remains the same, i.e., the lower forward voltage is preserved. This has the advantage of providing a voltage drop across the output resistor which remains small, so that dissipation is low.

The semiconductor substrate and the first and second epitaxial layers are preferably made of the same material, with the semiconductor substrate having a higher dopant concentration than and being of the same conductivity type as the first epitaxial layer. A particularly advantageous ratio of the forward voltage to the capacitance of the diode is achieved if the dopant concentration of the first epitaxial layer is at least twice as high as that of the second epitaxial layer. The first epitaxial layer may be thicker than, preferably twice as thick as, the second epitaxial layer. In another preferred embodiment, the semiconductor substrate and the first and second epitaxial layers are made of silicon and the insulating layer is made of silicon dioxide.

Figure 1:
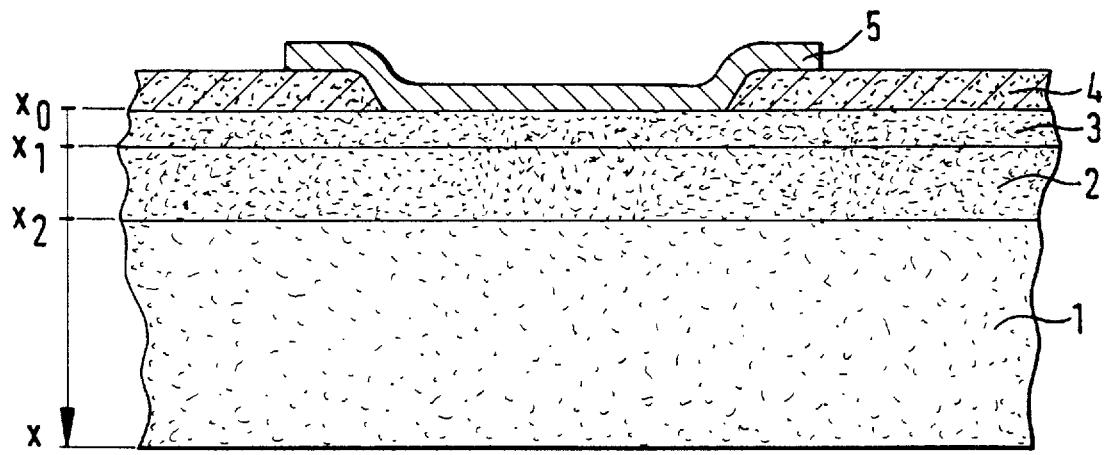
FIG. 1 is a cross-sectional view of one embodiment of a Schottky diode according to the invention.

Referring now to FIG. 1, a Schottky diode as one embodiment of the semiconductor device according to the present invention is shown. The Schottky diode of FIG. 1 consists of a semiconductor substrate 1, a first epitaxial layer 2, and a second epitaxial layer 3, which are arranged one above the other. On the second epitaxial layer 2, a patterned insulating layer 4 has been deposited. A metal layer 5, has been applied over an opening in the insulating layer 4 in such a way as to cover the opening and part of the adjoining insulating layer 4. Contact is made to this Schottky diode at the metal layer 4 and at the rear of the semiconductor substrate 1.

In one embodiment of the invention, the semiconductor substrate 1 is made of heavily n-type-doped silicon, the epitaxial layers 2 and 3 are of n-type silicon with a doping level well below that of the semiconductor substrate 1, the insulating layer 4 is made of silicon dioxide, and the metal layer is of a metal typical for Schottky diodes, such as chromium, molybdenum or platinum.

Figure 2:
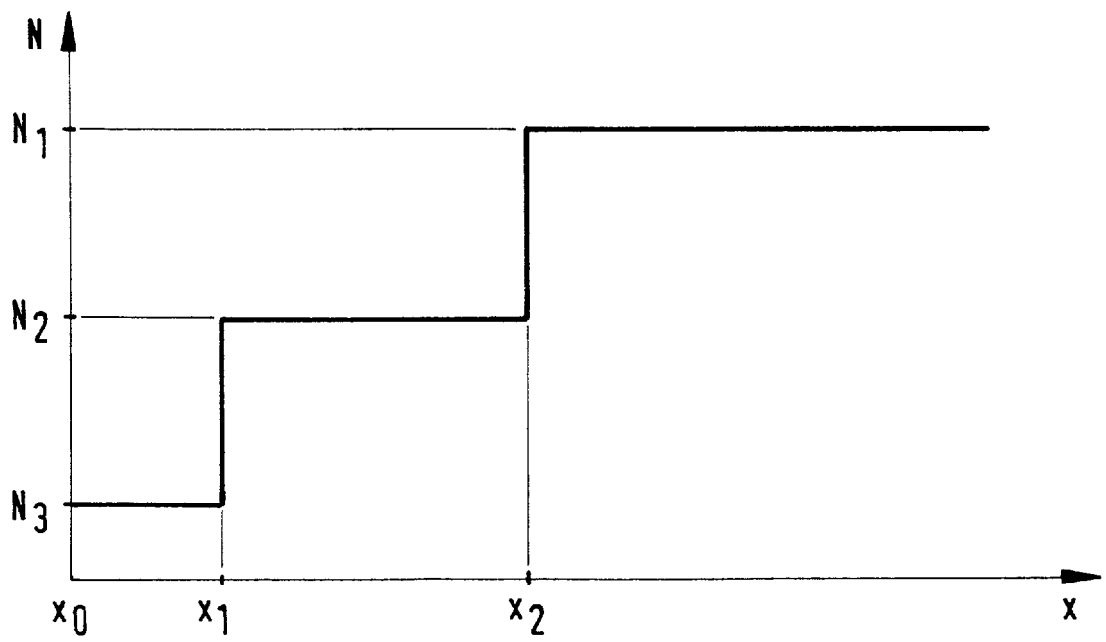
FIG. 2 shows schematically (not a true scale) the dopant concentration of the epitaxial layers of the Schottky diode of FIG. 1.

Referring to FIG. 2, the dopant concentration of the first and second epitaxial layers 2, 3 is shown schematically (not a true scale) as a function of the depth x of the epitaxial layers 2 and 3, beginning at the surface of the second epitaxial layer 3. Starting from the dopant concentration $N_1$, which represents the dopant concentration of the semiconductor substrate 1, the dopant concentration decreases to the value $N_2$ at the interface between the semiconductor substrate 1 and the first epitaxial layer 2, remains constant within the first epitaxial layer 2, and decreases to the value $N_3$ at the interface between the first epitaxial layer 2 and the second epitaxial layer 3, in which it remains constant. In the embodiment shown, the dopant concentration of the semiconductor substrate 1 is higher than the dopant concentration $N_2$ of the first epitaxial layer 2, the dopant concentration of the latter being higher than the dopant concentration $N_3$ of the epitaxial layer 3. The thickness $x_1$, of the second epitaxial layer is less than the thickness $x_2$ of the first epitaxial layer, which is less than the thickness of the semiconductor substrate 1. The dopant concentration $N_1$ of the semiconductor substrate typically ranges between $10^{18}$ and $10^{21}$ cm$^{-3}$, the dopant concentration $N_2$ of the first epitaxial layer 2 between $5 \times 10^{14}$ and $5 \times 10^{16}$ cm$^{-3}$, and the dopant concentration $N_3$ of the second epitaxial layer 3 between $10^{12}$ cm$^{-3}$ and a value less than the value $N_2$. A typical value for the thickness of the first epitaxial layer lies between 2 and 50 µm.

It should be understood that the embodiments described herein are merely exemplary and that a person skilled in the art may make many variations and modifications to these embodiments utilizing functionally equivalent elements to those described herein. Any and all such variations or modifications as well as others which may become apparent to those skilled in the art, are intended to be included within the scope of the invention as defined by the appended claims.

I claim:

1. A semiconductor device comprising:

a semiconductor substrate;

a first epitaxial layer of silicon deposited on said semiconductor substrate; and a second epitaxial layer of silicon deposited on said first epitaxial layer, wherein said first epitaxial layer of silicon has a predetermined dopant concentration within a range of from $5 \times 10^{14}$ cm$^{-3}$ to $5 \times 10^{16}$ cm$^{-3}$ and said second epitaxial layer of silicon has a predetermined dopant concentration lower than that of said first epitaxial layer;

wherein said first epitaxial layer has a thickness which is substantially twice the thickness of said second epitaxial layer.

2. The semiconductor device according to claim 1, further comprising an insulating layer deposited on said second epitaxial layer.

3. The semiconductor device according to claim 2, wherein said insulating layer is patterned.

4. The semiconductor device according to claim 3, further comprising a metal layer deposited on said patterned insulating layer.

5. The semiconductor device according to claim 2, further comprising a metal layer deposited on said insulating layer.

6. The semiconductor device according to claim 1, wherein said first and second epitaxial layers are of a same conductivity type.

7. The semiconductor device according to claim 1, wherein said semiconductor substrate is made of silicon.

8. The semiconductor device according to claim 7, wherein said semiconductor substrate has a first predetermined dopant concentration, said first predetermined dopant concentration of said semiconductor substrate being higher than said predetermined dopant concentration of said first epitaxial layer.

9. The semiconductor device according to claim 8, wherein said semiconductor substrate and said first epitaxial layer are of a same conductivity type.

10. The semiconductor device according to claim 8, wherein said second epitaxial layer has a predetermined dopant concentration within a range of a low value of $10^{12}$ cm$^{-3}$ to a value less than the dopant concentration of said first epitaxial layer.

11. The semiconductor device according to claim 2, wherein said insulating layer is made of silicon dioxide.

12. A semiconductor diode device having a low capacitance and an unchanged forward voltage, comprising:

a semiconductor substrate;

a first epitaxial layer of silicon deposited on said semiconductor substrate;

a second epitaxial layer of silicon deposited on said first epitaxial layer, said first and second epitaxial layers being of a same conductivity type, wherein said first epitaxial layer of silicon has a predetermined dopant concentration within a range of from $5 \times 10^{14}$ cm$^{-3}$ to $5 \times 10^{16}$ cm$^{-3}$ and said second epitaxial layer of silicon has a predetermined dopant concentration within a range of a low value of $10^{12}$ cm$^{-3}$ to a value less than the dopant concentration of said first epitaxial layer; and a patterned insulating layer deposited on said second epitaxial layer;

wherein said first epitaxial layer is thicker than said second epitaxial layer.

13. The semiconductor diode device according to claim 12, further comprising a metal layer deposited on said patterned insulating layer.

14. The semiconductor diode device according to claim 12, wherein said semiconductor substrate is made of silicon having a same conductivity type as said first and second epitaxial layers, said semiconductor substrate having a first predetermined dopant concentration higher than said predetermined dopant concentration of said first epitaxial layer.

15. The semiconductor diode device according to claim 12, wherein said predetermined dopant concentration of said first epitaxial layer is at least twice as high as said predetermined dopant concentration of said second epitaxial layer.

16. The semiconductor dioded device according to claim 12, wherein said first epitaxial layer is twice as thick as said second epitaxial layer.

17. The semiconductor diode device according to claim 14, wherein said insulating layer is made of silicon dioxide.

18. A semiconductor diode device comprising:

a semiconductor substrate of silicon material;

a first epitaxial layer of silicon deposited on said semiconductor substrate;

a second epitaxial layer of silicon deposited on said first epitaxial layer, said first and second epitaxial layers being of a same conductivity type, wherein said first epitaxial layer of silicon has a predetermined dopant concentration within a range of from $5 \times 10^{14}$ cm$^{-3}$ to $5 \times 10^{16}$ cm$^{-3}$ and said second epitaxial layer of silicon has a predetermined dopant concentration within a range of a low value of $10^{12}$ cm$^{-3}$ to a value less than the dopant concentration of said first epitaxial layer; and a patterned insulating layer deposited on said second epitaxial layer;

wherein said first epitaxial layer has a thickness which is substantially twice the thickness of said second epitaxial layer, and wherein said semiconductor substrate has a predetermined dopant concentration higher than said dopant concentration of said first epitaxial layer.

\* \* \* \* \*